US008922742B2

(12) United States Patent  
Nagami

(10) Patent No.: US 8,922,742 B2  
(45) Date of Patent: Dec. 30, 2014

(54) IPS-TYPE LIQUID CRYSTAL DISPLAY DEVICE HAVING IMPROVED CAPACITANCE BETWEEN PIXEL ELECTRODE AND COUNTER ELECTRODE

(75) Inventor: Takahiro Nagami, Mobara (JP)

(73) Assignees: Japan Display Inc., Tokyo (JP); Panasonic Liquid Crystal Display, Co., Ltd., Hyogo-ken (JP)

( * ) Notice: Subject to any disclaimer, the term of this patent is extended or adjusted under 35 U.S.C. 154(b) by 709 days.

(21) Appl. No.: 13/010,013

(22) Filed: Jan. 20, 2011

(65) Prior Publication Data

US 2011/0181805 A1    Jul. 28, 2011

(30) Foreign Application Priority Data

Jan. 22, 2010   (JP) ................................. 2010-011670

(51) Int. Cl.
G02F 1/1343    (2006.01)
G02F 1/1362    (2006.01)

(52) U.S. Cl.
CPC .... G02F 1/134363 (2013.01); G02F 1/136286 (2013.01)
USPC ................................. 349/141; 349/38; 349/39

(58) Field of Classification Search
USPC ............................................. 349/141, 38, 39
See application file for complete search history.

(56) References Cited

U.S. PATENT DOCUMENTS

| 5,151,689 | A | 9/1992 | Kabuto et al. |
| 6,292,237 | B1 * | 9/2001 | Hebiguchi ..................... 349/39 |
| 2006/0120160 | A1 * | 6/2006 | Park et al. ................ 365/185.22 |
| 2006/0290826 | A1 * | 12/2006 | Paik et al. ........................ 349/38 |

FOREIGN PATENT DOCUMENTS

JP      2-42420      2/1990

* cited by examiner

*Primary Examiner* — Lauren Nguyen

(74) *Attorney, Agent, or Firm* — Antonelli, Terry, Stout & Kraus, LLP.

(57) ABSTRACT

There is provided a liquid crystal display device that enables increasing the capacitance between a pixel electrode and a common electrode without bringing about a significant decrease in the pixel aperture ratio. An In-Plane Switching LCD device in which a drain signal is supplied from one drain signal line to two pixel columns is configured such that there is a section having no drain signal line between adjacent pixels and a source electrode which is connected to a pixel electrode of a thin-film transistor extends into a contiguous pixel region that does not serve as an effective pixel region to provide one electrode of a capacitive element. A common electrode is formed in each pixel and the one electrode of the capacitive element is laid overlapping the common electrode with an insulation film intervening therebetween.

4 Claims, 6 Drawing Sheets

IPS-TYPE LIQUID CRYSTAL DISPLAY DEVICE HAVING IMPROVED CAPACITANCE BETWEEN PIXEL ELECTRODE AND COUNTER ELECTRODE

CLAIM OF PRIORITY

The present application claims priority from Japanese Patent Application JP 2010-011670 filed on Jan. 22, 2010, the content of which is hereby incorporated by reference into this application.

FIELD OF THE INVENTION

The present invention relates to a liquid crystal display device and particularly to a liquid crystal display device in which a drain signal is supplied from one drain signal line to two pixel columns.

BACKGROUND OF THE INVENTION

A liquid crystal display (LCD) device in which a drain signal is supplied from one drain signal line to two pixel columns is disclosed, e.g., in Japanese Published Unexamined Patent Application No. Hei 2-42420 as mentioned below.

Such an LCD device is adapted such that, in a set of pixels arranged row-wise among pixels arranged in a matrix, pixels arranged alternately (e.g., odd positioned pixels) are selected by a gate signal line (which may be referred to as a first gate signal line) laid along one edge of the set of pixels and other pixels (even positioned pixels) are selected by a gate signal line (which may be referred to as a second gate signal line) laid along the other edge of the set of pixels.

The above LCD device is also configured such that a drain signal line is laid to run between, e.g., an odd positioned pixel and an even positioned pixel which line up contiguously, but not laid between an even positioned pixel and an odd positioned pixel which line up contiguously. When an odd positioned pixel is selected by the first signal gate line, the pixel is supplied with an image signal from a drain signal line adjacent to this pixel. When an even positioned pixel is selected by the second signal gate line, the pixel is supplied with an image signal from a drain signal line adjacent to this pixel.

Accordingly, an image signal can be supplied via one drain signal line to two pixels disposed at either side of this drain signal line, respectively. Therefore, the thus configured LCD device produces an effect in which the number of drain lines for supplying an image signal to each pixel can be half the number required conventionally.

A liquid crystal display device referred to as a so-called In-Plane Switching LCD is also known. For example, such LCD is equipped for each pixel with a common electrode including a planar pattern and a pixel electrode including a plurality of linear patterns, superposed over the common electrode with an insulation film intervening therebetween.

The thus configured LCD device can offer superior viewing angle performance, because liquid crystal molecules are driven by generating an electric field having a component parallel with substrate between the pixel electrode and the common electrode. By producing each of the common and pixel electrodes with a translucent, electrically conductive film such as, e.g., ITO (Indium Tin Oxide), the pixel aperture ratio can be improved.

In the thus configured LCD device, the common and pixel electrodes are configured to overlap one over the other with an insulation film intervening therebetween. A capacitive element is formed between the pixel and common electrodes, the above insulation film acting as a dielectric film for the capacitive element without requiring a special region. When an image signal is supplied to a pixel electrode, this capacitive element serves to store the image signal longer in the pixel electrode over a long time.

SUMMARY OF THE INVENTION

An In-Plane Switching LCD device, when driven, can provide the above-noted effect and is capable of implementing a higher definition display.

In the case of a higher definition LCD device, however, the capacitance between a pixel electrode and a common electrode in each pixel becomes insufficient and there is a need for creating an additional capacitive element to further increase the capacitance. In this case, creating an additional capacitive element within a pixel region without entailing an increase in manufacturing man-hour narrows the effective pixel region because of the above capacitive element, which results in a significant decrease in the pixel aperture ratio.

An object of the present invention is to provide a liquid crystal display device that enables increasing the capacitance between a pixel electrode and a common electrode in each pixel without bringing about a significant decrease in the pixel aperture ratio.

Taking into consideration the fact that a section having no drain signal line exists between adjacent pixels in the LCD structure in which a drain signal is supplied from one drain signal line to two pixel columns, a liquid crystal display device of the present invention is configured such that a source electrode, which is connected to a pixel electrode of a thin-film transistor, extends into a contiguous pixel region that does not serve as an effective pixel region or into a section of boundary with a contiguous pixel to provide one electrode of a capacitive element. A common electrode is formed in each pixel of In-Plane Switching LCD and the above one electrode of the capacitive element can easily be laid overlapping the common electrode with an insulation film intervening therebetween.

Constituents of the present invention, for example, may be set forth as below.

(1) A liquid crystal display device of the present invention including:

a first substrate and a second substrate placed to sandwich a liquid crystal layer therebetween; and pixels over a plane, which faces the liquid crystal layer, of the first substrate, each pixel including a first electrode of a planar pattern and a second electrode including a plurality of linear patterns placed over or under the first electrode with an insulation film intervening therebetween, wherein one of the first and second electrodes serves as a pixel electrode which is supplied with a signal which is independent per pixel and the other electrode serves as a common electrode, wherein a first gate signal line and a second gate signal line extending in a first direction are formed to sandwich a plurality of pixels disposed side by side in the first direction, given that two adjacent pixels disposed side by side between the first and second gate signal lines are referred to as a first pixel and a second pixel, wherein a first drain signal line and a second drain signal line extending in a second direction perpendicular to the first direction are laid to sandwich these first pixel and second pixel therebetween, wherein the first pixel is configured such that an image signal from the first drain signal line is supplied to the pixel electrode via a first thin-film transistor which is driven by a signal from the first gate signal line and placed close to the first gate signal line, wherein the second pixel is configured such that an image signal from the second drain signal line is supplied to the pixel electrode via a second thin-film transistor which is driven by a signal from the second gate signal line and placed close to the second gate signal line, wherein a source electrode, which is electrically connected to the pixel electrode of the first thin-film transistor, has an extension part extending into a region of the second pixel, close to the first gate signal line, the extension part being formed overlapping the common electrode formed in the second pixel, when viewed from a planar view, with a second insulation film intervening between the extension part and the common electrode, and wherein a source electrode, which is electrically connected to the pixel electrode of the second thin-film transistor, has an extension part extending into a region of the first pixel, close to the second gate signal line, the extension part being formed overlapping the common electrode formed in the first pixel, when viewed from a planar view, with the second insulation film intervening between the extension part and the common electrode.

(2) The liquid crystal display device of the present invention set fourth in (1), wherein the source electrode of the first thin-film transistor has an extension part running in a region between the pixel electrode of the first pixel and the pixel electrode of the second pixel, when viewed from a planar view, the extension part being formed overlapping the common electrode formed in the region with the second insulation film intervening between the extension part and the common electrode, and wherein the source electrode of the second thin-film transistor has an extension part running in a region between the pixel electrode of the second pixel and the pixel electrode of the first pixel, when viewed from a planar view, the extension part being formed overlapping the common electrode formed in the region with the second insulation film intervening between the extension part and the common electrode.

(3) The liquid crystal display device of the present invention set fourth in (1), wherein the source electrode of the first thin-film transistor is equipped with a first pad that provides a contact with the pixel electrode of the first pixel, the first pad being adjacent to the first thin-film transistor and the first gate signal line, and the source electrode of the second thin-film transistor is equipped with a second pad that provides a contact with the pixel electrode of the second pixel, the second pad being adjacent to the second thin-film transistor and the second gate signal line.

(4) The liquid crystal display device of the present invention set fourth in (3), wherein the first pad is formed between the source electrode of the first thin-film transistor and the extension part of the source electrode extending into the region of the second pixel, close to the first gate signal line, and the second pad is formed between the source electrode of the second thin-film transistor and the extension part of the source electrode extending into the region of the first pixel, close to the second gate signal line.

(5) The liquid crystal display device of the present invention set fourth in (1), wherein a first light shielding film and a second light shielding film are formed on a plane, which faces the liquid crystal layer, of the second substrate, the first light shielding film covering at least the first gate signal line and the first thin-film transistor and the second light shielding film covering at least the second gate signal line and the second thin-film transistor, when viewed from a planar view, wherein the extension part of the source electrode of the first thin-film transistor is formed, at least in part, overlapping the first light shielding film, and wherein the extension part of the source electrode of the second thin-film transistor is formed, at least in part, overlapping the second light shielding film.

(6) A liquid crystal display device of the present invention including:

a first substrate and a second substrate placed to sandwich a liquid crystal layer therebetween; and pixels arranged in a matrix over a plane, which faces the liquid crystal layer, of the first substrate, each pixel including a first electrode of a planar pattern and a second electrode including a plurality of linear patterns placed over or under the first electrode with an insulation film intervening therebetween, wherein one of the first and second electrodes serves as a pixel electrode which is supplied with a signal which is independent per pixel and the other electrode serves as a common electrode, wherein a first gate signal line and a second gate signal line extending in a first direction are formed to sandwich a plurality of pixels disposed side by side in the first direction, given that two adjacent pixels disposed side by side between the first and second gate signal lines are referred to as a first pixel and a second pixel, wherein a first drain signal line and a second drain signal line extending in a second direction perpendicular to the first direction are laid to sandwich these first pixel and second pixel therebetween, wherein the first pixel is configured such that an image signal from the first drain signal line is supplied to the pixel electrode via a first thin-film transistor which is driven by a signal from the first gate signal line and placed close to the first gate signal line, wherein the second pixel is configured such that an image signal from the second drain signal line is supplied to the pixel electrode via a second thin-film transistor which is driven by a signal from the second gate signal line and placed close to the second gate signal line, wherein a source electrode, which is electrically connected to the pixel electrode of the first thin-film transistor, has an extension part running in a region between the pixel electrode of the first pixel and the pixel electrode of the second pixel, when viewed from a planar view, the extension part being formed overlapping the common electrode formed in the region with a second insulation film intervening between the extension part and the common electrode, and wherein a source electrode, which is electrically connected to the pixel electrode of the second thin-film transistor, has an extension part running in a region between the pixel electrode of the second pixel and the pixel electrode of the first pixel, when viewed from a planar view, the extension part being formed overlapping the common electrode formed in the region with the second insulation film intervening between the extension part and the common electrode.

(7) The liquid crystal display device of the present invention set fourth in (6), wherein the source electrode of the first thin-film transistor has an extension part extending into a region of the second pixel, close to the first gate signal line, the extension part being formed overlapping the common electrode formed in the second pixel, when viewed from a planar view, with the second insulation film intervening between the extension part and the common electrode, and wherein the source electrode of the second thin-film transistor has an extension part extending into a region of the first pixel, close to the second gate signal line, the extension part being formed overlapping the common electrode formed in the first pixel, when viewed from a planar view, with the second insulation film intervening between the extension part and the common electrode.

(8) The liquid crystal display device of the present invention set fourth in (6), wherein the source electrode of the first thin-film transistor is equipped with a first pad that provides a contact with the pixel electrode of the first pixel, the first pad being adjacent to the first thin-film transistor and the first gate signal line, and the source electrode of the second thin-film transistor is equipped with a second pad that provides a contact with the pixel electrode of the second pixel, the second pad being adjacent to the second thin-film transistor and the second gate signal line.

(9) The liquid crystal display device of the present invention set fourth in (6), wherein the first pad is formed between the source electrode of the first thin-film transistor and the extension part of the source electrode running in the region between the pixel electrode of the first pixel and the pixel electrode of the second pixel and the second pad is formed between the source electrode of the second thin-film transistor and the extension part of the source electrode running in the region between the pixel electrode of the second pixel and the pixel electrode of the first pixel.

(10) A liquid crystal display device including a first substrate and a second substrate sandwiching a liquid crystal layer therebetween and pixels over a plane which faces the liquid crystal layer of the first substrate, each pixel including a pixel electrode which is supplied with an image signal and a common electrode placed over or under the pixel electrode with a first insulation film intervening therebetween, wherein a plurality of pixels are disposed to make pixel rows along a first direction and make pixel columns along a second direction perpendicular to the first direction, the liquid crystal display device further including two gate lines laid for one pixel row and one image signal line laid for two pixel columns, wherein each pixel row includes a first pixel including a first thin-film transistor which is connected to a first gate signal line and a second pixel including a second thin-film transistor which is connected to a second gate signal line, a source electrode of the first thin-film transistor is electrically connected to the pixel electrode of the first pixel and has a first extension part extending into a region of the second pixel and laid overlapping the common electrode of the second pixel with a second insulation film intervening between the extension part and the common electrode, and a source electrode of the second thin-film transistor is electrically connected to the pixel electrode of the second pixel, extends into a region of the first pixel, and is laid overlapping the common electrode formed in the first pixel with the second insulation film intervening therebetween.

(11) A liquid crystal display device including a first substrate and a second substrate sandwiching a liquid crystal layer therebetween and pixels over a plane which faces the liquid crystal layer of the first substrate, each pixel including a pixel electrode which is supplied with an image signal and a common electrode placed over or under the pixel electrode with a first insulation film intervening therebetween, wherein a plurality of pixels are disposed to make pixel rows along a first direction and make pixel columns along a second direction perpendicular to the first direction, the liquid crystal display device further including two gate lines laid for one pixel row and one image signal line laid for two pixel columns, wherein each pixel row includes a first pixel including a first thin-film transistor which is connected to a first gate signal line and a second pixel including a second thin-film transistor which is connected to a second gate signal line, a source electrode of the first thin-film transistor is electrically connected to the pixel electrode of the first pixel and has a first extension part extending along the first direction between the first pixel and the second pixel, a source electrode of the second thin-film transistor is electrically connected to the pixel electrode of the second pixel and has a second extension part extending along the first direction between the first pixel and the second pixel, and the first extension part and the second extension part are laid facing each other across a gap therebetween.

The foregoing constituents are only exemplary and the present invention can be modified appropriately without departing from the scope of the technical concept thereof. Examples of further constituents of the present invention other than those set forth above will be made apparent from the description throughout the specification of the present application or the drawings.

The thus configured liquid crystal display device becomes capable of increasing the capacitance between a pixel electrode and a common electrode without bringing about a significant decrease in the pixel aperture ratio.

Other advantageous effects of the present invention will be made apparent from the description throughout the specification.

DETAILED DESCRIPTION OF PREFERRED EMBODIMENT

In the following, exemplary embodiments of the present invention will be described with reference to the relevant drawings. In the respective drawings and exemplary embodiments, same or similar components are assigned the same reference designators and their descriptions are not repeated.

First Embodiment

Display Region of an Equivalent Circuit

Figure 2:
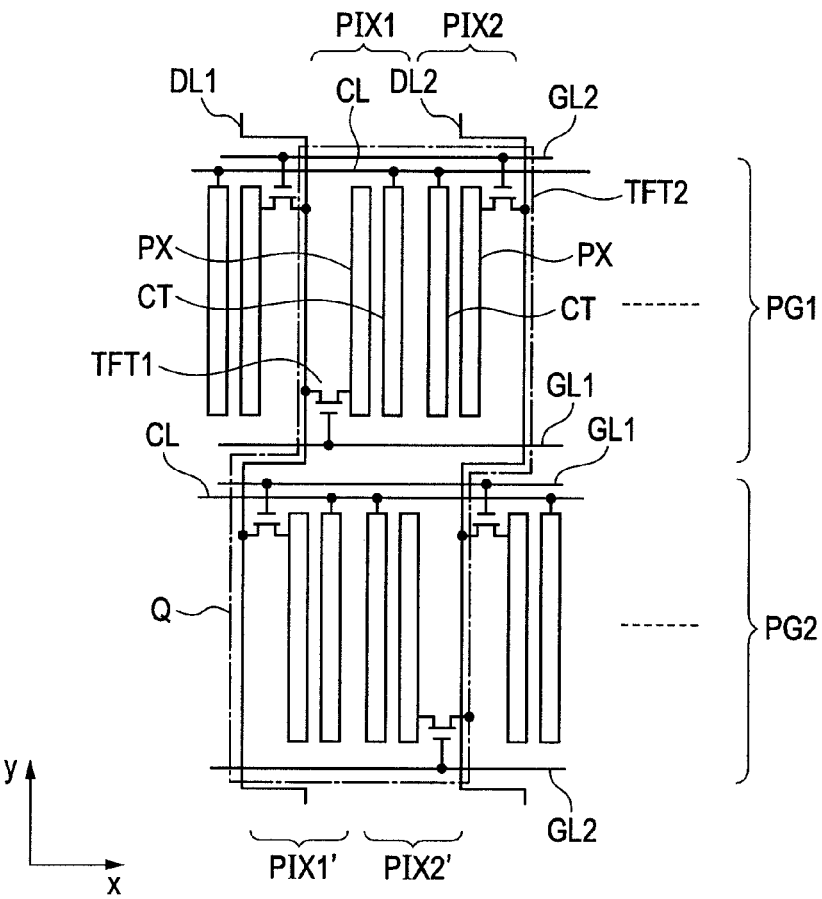
FIG. 2 is a diagram depicting an equivalent circuit in the display region according to the first embodiment of the liquid crystal display device of the present invention.

FIG. 2 is a diagram of an equivalent circuit that is formed in a display region of a plane, which faces a liquid crystal layer, of one substrate (hereinafter referred to as a first substrate SUB1) of a pair of substrates placed facing each other across the liquid crystal layer. This equivalent circuit adopts a driving method in which a drain signal is supplied from one drain signal line to two pixel columns. In this equivalent circuit, two gate signal lines are laid along one pixel row. Among a large number of pixels arranged in a matrix in the display region, this equivalent circuit depicts, e.g., six adjacent pixels with signal lines corresponding to their positions in a practical geometric layout.

First, in FIG. 2, in an upper stage, e.g., three pixels are arranged side by side in the x direction and, in a lower stage, e.g., three pixels are arranged side by side in the x direction. In this case, for example, the pixels in the lower stage are shifted by a half pitch with respect to the corresponding pixels in the upper stage. All pixels are assumed to be arranged such that the direction in which the pixels are shifted will be reversed alternately in each of stages that will continue downward. However, all pixels may be arranged straight in the y direction of FIG. 2 without being shifted in this way.

A first gate signal line GL1 is laid along one edge (the lower edge as shown) of a first pixel row (denoted by PG1 in FIG. 2) which includes the pixels in the upper stage and a second gate signal line GL2 is laid along the other edge (the upper edge as shown) thereof. In addition, a first gate signal line GL1 is laid along one edge (the upper edge as shown) of a second pixel row (denoted by PG2 in FIG. 2) which includes the pixels in the lower stage and a second gate signal line GL2 is laid along the other edge (the lower edge as shown) thereof. The reason why the positions of the first and second gate signal lines GL1 and GL2 for the first pixel row PG1 are opposite to the positions of the first and second gate signal lines GL1 and GL2 for the second pixel row PG2 is that the components of each pixel in the pixel row PG1 and those of each pixel in the pixel row PG2 are disposed in positions inverted in a vertical direction. Two gate signal lines GL are laid along one pixel row in this way, so that each pixel in each pixel row is selected by the first gate signal line GL1 and the second gate signal line GL2.

Here, two adjacent pixels, e.g., in the first pixel row PG1 are referred to as a first pixel PIX1 and a second pixel PIX2, respectively. The reason for this is that the first pixel PIX1 and the second pixel PIX2 include the same components, but the positions of these components viewed from a planar view are inverted in vertical and horizontal directions in a positional relationship.

In particular, the first pixel PIX1 is configured such that a signal (image signal) from a drain signal line DL (denoted by DL1 in FIG. 2) is supplied to its pixel electrode PX via a thin-film transistor TFT (denoted by TFT1 in FIG. 2) which is driven (turned ON) by a signal (scan signal) from the first gate signal line GL1 and placed close to the first gate signal line GL1. The drain signal line DL1 which is connected to the first pixel is laid along an opposite side from the second pixel PIX2 and extends along the y direction of FIG. 2. The second pixel PIX2 is configured such that a signal (image signal) from a drain signal line DL (denoted by DL2 in FIG. 2) is supplied to its pixel electrode PX via a thin-film transistor TFT (denoted by TFT2 in FIG. 2) which is driven (turned ON) by a signal (scan signal) from the second gate signal line GL2 and placed close to the second gate signal line GL2. The drain signal line DL2 which is connected to the second pixel is laid along an opposite side from the first pixel PIX1 and extends along the y direction of FIG. 2.

Such constitutive relationship between the first pixel PIX1 and the second pixel PIX2 holds true for first pixels PIX1 and second pixels PIX1 which are disposed in order repeatedly in the x direction of FIG. 2 in the first pixel row PG1. Thus, the drain signal lines DL1 and DL2 are configured to allow the supply of an image signal to each pixel on either side thereof, so that there is no drain signal line DL between the first and second pixels PIX1 and PIX2. The drain signal lines DL1 and DL2 are formed in a pattern extending in a meandering line, because the pixels in each pixel row PG shifted by a half pitch with respect to those in one row above in a direction reversed alternately in each of stages that will continue downward, as described above.

In each of the first and second pixels PIX1 and PIX2, a common electrode CT is formed which produces an electric field between it and a pixel electrode PX. The electric field that is produced between the pixel electrode PX and the common electrode CT is adapted to have a component acting in parallel with the first substrate SUB1, so that display can be implemented in a so-called In-Plane Switching mode. Concrete configurations of the pixel electrode PX and the common electrode CT will be described later, using FIG. 1. The common electrodes CT of the respective pixels at least in each pixel row GP are connected in common by a common signal line CL. A reference signal is supplied to each common electrode CT, whereas a pixel signal is supplied to each pixel electrode PX via a drain signal line DL and a thin-film transistor TFT. A voltage difference between these signals acts to produce the above electric field.

As shown within a domain framed by a dashed-dotted line in FIG. 2, in the corresponding first pixel (denoted by PIX1' in FIG. 2) and second pixel (denoted by PIX2' in FIG. 2) in the second row PG2, their components are disposed in positions vertically inverted with respect to the components of the above-mentioned first pixel PIX1 and second pixel PIX2 in the first row PG1. Except for this, however, the positional relationship between the first pixel and second pixel in the second row PG2 is the same as that between the first pixel and second pixel in the first row PG1.

Figure 8:
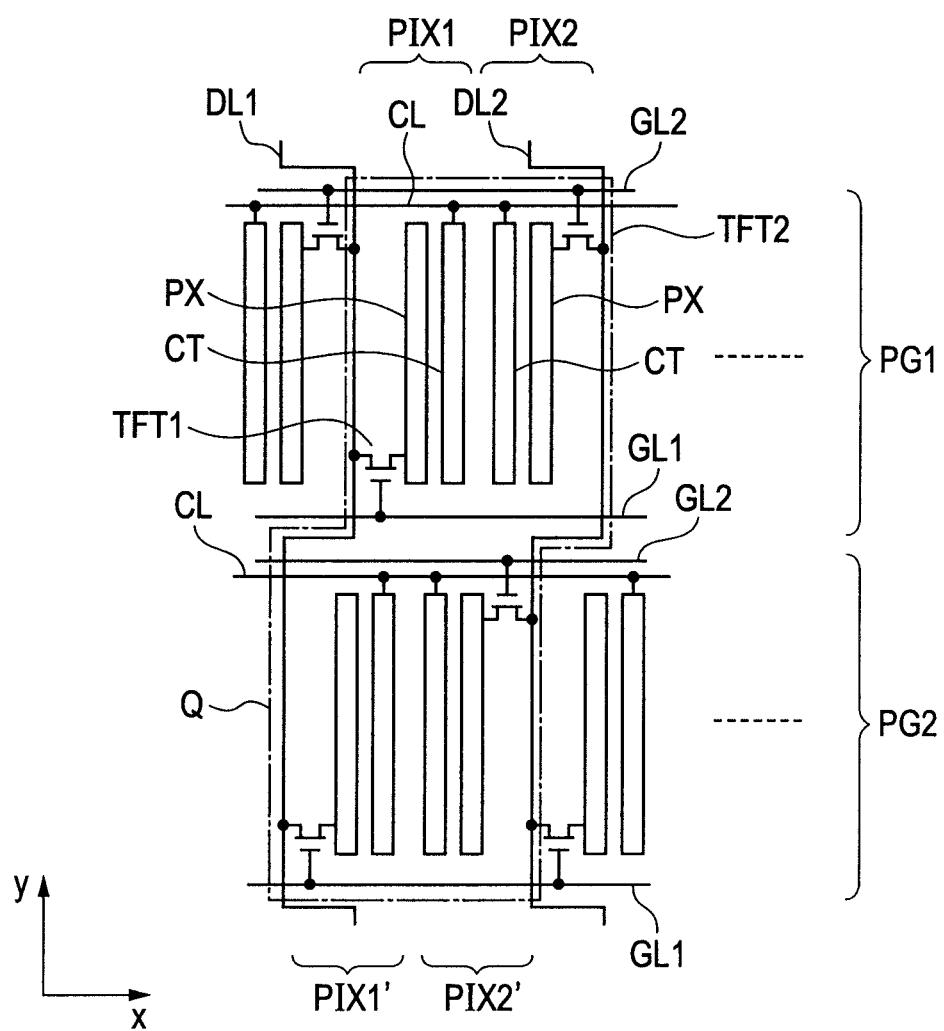
FIG. 8 is a structural diagram of the fifth embodiment of the liquid crystal display device of the present invention.

FIG. 8 is a diagram for a case where the first pixel row and the second pixel row are constructed in a similar fashion. The structures of pixels in both rows are inverted as shown in FIG. 2, whereas, are not inverted in FIG. 8. A first gate signal line GL1 is laid along one edge (the lower edge as shown) of the first pixel row (denoted by PG1 in FIG. 8) which includes the pixels in the upper stage and a second gate signal line GL2 is laid along the other edge (the upper edge as shown) thereof. In addition, a first gate signal line GL1 is laid along one edge (the lower edge as shown) of the second pixel row (denoted by PG2 in FIG. 8) which includes the pixels in the lower stage and a second gate signal line GL2 is laid along the other edge (the upper edge as shown) thereof. Other details are the same as those in FIG. 2 and, therefore, their description is omitted.

<Pixel Structure>

Figure 1:
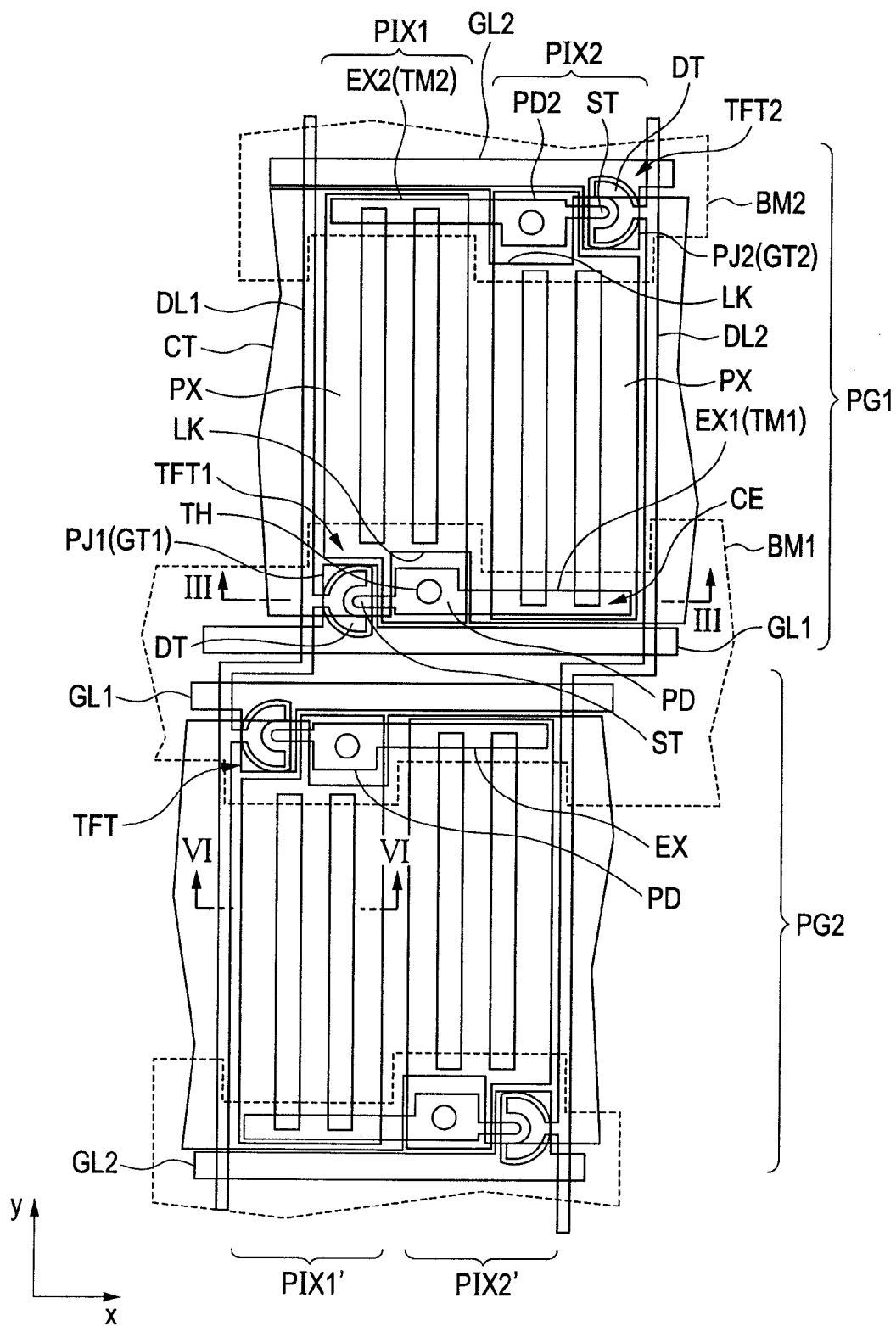
FIG. 1 is a plane view showing a structure of pixels in a display region according to a first embodiment of a liquid crystal display device of the present invention.
Figure 3:
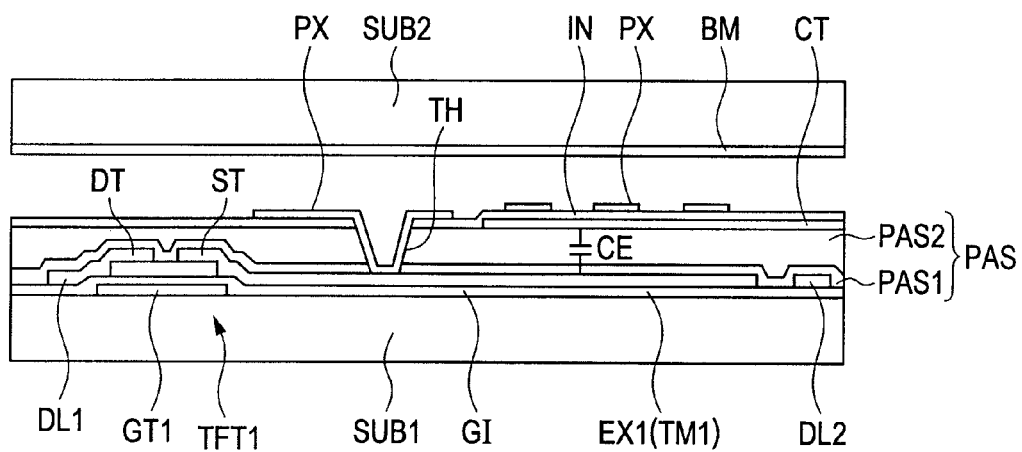
FIG. 3 is a cross-sectional diagram along a line III-III in FIG. 1.

FIG. 1 shows a plan view of pixels formed on the plane, which faces the liquid crystal layer of the first substrate SUB1, and depicts a structural part within the domain Q framed by a dashed-dotted line in FIG. 2. FIG. 3 is a diagram showing a cross section along a line III-III in FIG. 2, wherein the cross section of the first substrate is depicted together with a second substrate SUB2 placed oppositely across the liquid crystal layer.

In FIG. 1, gate signal lines GL are formed on the plane (surface), which faces the liquid crystal layer, of the first substrate SUB1 (see FIG. 3). The gate signal lines GL extend in the x direction of FIG. 1. From top in FIG. 1, the second gate signal line GL2 and the first gate signal line GL1 which are the gate signal lines GL for the first pixel row PG1 and the first gate signal line GL1 and the second gate second gate signal line GL2 which are the gate signal lines GL for the second pixel row PG2 are formed.

For example, taking the first pixel row PG1 as an example, the first pixel row includes a projection PJ1 from the gate signal line GL1 toward the region of formation of the first pixel PIX1 and a projection PJ2 from the gate signal line GL2 toward the region of formation of the second pixel PX2. The projection PJ1 serves as a gate electrode GT1 of a thin-film transistor TFT1 and the projection PJ2 serves as a gate electrode GT2 of a thin-film transistor TFT2. The thin-film transistor TFT1 is formed close to the first drain signal line DL1 which will be described later and the thin-film transistor TFT2 is formed close to the second drain signal line DL2 which will be described later.

Over the surface of the first substrate, an insulation film GI (see FIG. 3) covering the gate signal lines GL, inter alia, is formed. This insulation film GI serves as a gate insulation film in the region of formation of a thin-film transistor TFT.

Taking the first pixel PIX1 in the first pixel row PG1 as an example, an island shaped semiconductor layer AS made from, e.g., amorphous silicon is formed in a portion of the insulation film GI overlying the gate electrode GT2. This semiconductor layer AS, for example, has a semicircular shape. This semiconductor layer AS becomes a semiconductor layer of a thin-film transistor TFT1. By forming a drain electrode DT and a source electrode ST facing each other on the upper surface of the semiconductor layer, the thin-film transistor TFT1 of a so-called Metal Insulator Semiconductor (MIS) structure is formed. Here, the drain electrode DT is formed together with formation of the first drain signal line DL1, so that it is formed by using an extension part of the first drain signal line DL1. The source electrode ST is formed together with formation of the drain electrode DT and formed in conjunction with a pad PD (denoted by PD1 in FIG. 1) placed close to the first gate signal line GL1. The drain electrode DT and the source electrode ST of the thin-film transistor TFT operate replacing each other depending on bias application condition. In this specification, however, for the sake of simplicity, an electrode which is connected to the drain signal line DL is defined as the drain electrode DT and an electrode which is connected to the pixel electrode PX is defined as the source electrode ST. These electrodes will be so mentioned hereinafter. The drain electrode DT has a curved pattern along a circular portion of the semiconductor layer AS and the source electrode ST is placed facing the concave side of the drain electrode DT. Thereby, the channel width of the thin-film transistor TFT1 can be broadened. The pad PD1 is placed close to the first gate signal line GL1 and provides a contact with the pixel electrode PX which will be described later in the first pixel PIX1. This pad PD1 has an extension part EX (denoted by EX1 in FIG. 1) which is formed together with the pad PD1. This extension part EX1 extends close to the first gate signal line GL1 and into the region of formation of the second pixel PIX2. This extension part EX1 serves as one electrode TM (denoted by TM1 in FIG. 1) of a capacitive element CE which will be described later. The extension part EX1 will be discussed later.

For the second pixel PIX in the first pixel row PG1, a thin-film transistor TFT2 and a pad PD (denoted by PD2 in FIG. 1) is formed in a similar fashion. The pad PD2 also has an extension part EX (denoted by EX2 in FIG. 1) which is formed together with the pad PD2. In this case, these components are formed in positions inverted in vertical and horizontal directions with respect to the corresponding components of the first pixel PIX1. That is, the thin-film transistor TFT2 is formed, overlying the gate electrode GT2 of the second gate signal line GL2. The drain electrode DT of the thin-film transistor TFT2 is formed by using an extension part of the second drain signal line DL2. The source electrode ST thereof is formed in conjunction with a pad PD2 placed close to the second gate signal line GL2. The extension part EX2 extends close to the second gate signal line GL2 and into the region of formation of the first pixel PIX1. This extension part EX2 also serves as one electrode TM (denoted by TM2 in FIG. 1) of a capacitive element CE which will be described later.

Over the surface of the first substrate SUB1, a passivating film PAS (see FIG. 3) covering the thin-film transistor, drain signal lines DL, etc., inter alia, is formed. This passivating film PAS includes a laminated body in which, e.g., a passivating film PAS1 (see FIG. 3) made of, e.g., an inorganic insulation film and a passivating film PAS2 (see FIG. 3) made of an organic insulation film are laminated in order. By virtue of the organic insulation film that can be formed by depositing the upper passivating film PAS2, the surface of the passivating film PAS can be planarized.

A common electrode CT is formed on the upper surface of the passivating film PAS. The common electrode CT is produced by a translucent, electrically conductive film made from, e.g., Indium Tin Oxide (ITO). The common electrode CT is configured as a strip-shaped component that is disposed so as to cover all pixels PIX in common in the same pixel row PG and thus provided with the common signal line CL shown in FIG. 2. That is, the common electrode CT is formed as a planar pattern in each pixel PIX and in continuity with the common electrode CT of an adjacent pixel PIX in the same pixel row PG. In this case, when viewed from a planar view, the common electrode CT is formed such that its one edge (the lower edge as shown) is positioned close to or overlapping the first gate signal line GL1 and its other edge (the upper edge as shown) is positioned close to or overlapping the second gate signal line GL2. In addition, the common electrode CT has a cut-out portion LK in a section where it overlaps with the above-mentioned pad PD. The pad PD needs to be connected to the pixel electrode PX which will be described later through a contact hole (denoted by TH in FIG. 1). In this case, a short circuit between the pixel electrode PX and the common electrode CT circuit can be avoided by the above cut-out portion LK. The common electrode CT may be formed so as to continue over the image display region.

Over the surface of the first substrate SUB1, an insulation film IN (see FIG. 3) covering the common electrode, inter alia, is formed. On the upper surface of this insulation film IN, pixel electrode elements PX are formed in every region of each pixel PIX. The pixel electrode elements PX are produced by a translucent, electrically conductive film made from, e.g., Indium Tin Oxide (ITO). The pixel electrode elements PX are formed as a plurality of linear patterns (e.g., three patterns are shown in FIG. 2) that extend in the y direction of FIG. 2 and are disposed side by side. The pixel electrode elements PX of linear patterns shown in FIG. 2 have a shape longer in the y direction than in the x direction. In this case, both ends of the plurality of pixel electrode elements PX of linear patterns are, respectively, connected in common and a common connection point near the thin-film transistor TFT is connected to the above-mentioned pad PD through the contact hole TH defined in the insulation film IN and the passivating film PAS. Thereby, each pixel electrode element PX is electrically connected to the source electrode ST of the thin-film transistor TFT.

Here, the pixel electrode elements PX are formed, superposed over the common electrode CT with the insulation film IN intervening therebetween, resulting in that capacitive elements are formed between each pixel electrode element PX and the common electrode CT, the insulation film IN acting as a dielectric film for the capacitive elements. Due to recent demands for higher definition liquid crystal display devices, the above capacitive elements in each pixel would become unable to provide a sufficient capacitance, as already noted. For this reason, in the first embodiment, taking the first pixel PIX1 in the first pixel row PB1 as an example, the source electrode ST of the thin-film transistor TFT1 is positioned close to the first gate line GL1 and provided with the extension part EX extending into the region of formation of the second pixel PIX2, as described above. In this case, since no drain line DL runs in a boundary section between the first pixel PIX1 and the second pixel PX2, the above extension part EX1 that is formed together with the formation of the drain signal line DL can be disposed, as an independent electrode, extending into the region of formation of the second pixel PIX2. The extension part EX1 is formed, overlapping (underlying) the common electrode CT with the passivating film PAS intervening therebetween, as shown in FIG. 3, thus resulting in that a capacitive element CE is formed between the extension part EX1 and the common electrode CT, the passivating film PAS acting as a dielectric film for the capacitive element. Since the extension part EX1 and the pixel electrode PX have equal potentials, the above capacitive element CE can act to increase the capacitance between the pixel electrode PX and the common electrode CT. Here, the extension part EX1 is disposed close to the first gate signal line GL1 in order to prevent the extension part EX1 from entering the effective pixel region (an aperture region of a black matrix BM which will be described later) of the second pixel PIX2.

As for the first pixel PIX1' and the second pixel PIX2' in the second pixel row PG2, their structure is the same as described above, although their components are disposed in the positions vertically inverted with respect to the components of the above first and second pixels PIX1 and PIX2.

Moreover, an alignment film covering the pixel electrode PX, inter alia, is formed over the surface of the first substrate SUB1, but the depiction of this alignment film is omitted. This alignment film comes in direct contact with liquid crystals and is adapted to determine an orientation in which liquid crystal molecules are initially aligned.

In FIG. 1, a black matrix (light shielding film) formed on a plane, which faces the liquid crystal layer, of a second substrate SUB2 (see FIG. 3) is also shown superimposedly in the plane view. This black matrix BM is formed around a boundary between adjacent pixel rows PG, as shown in FIG. 1. In FIG. 1, a black matrix which covers the first gate signal line GL1, first thin-film transistor TFT1, pad PD1, and extension part EX1 in the first pixel row PG1 is denoted by BM1 and a black matrix which covers the second gate signal line GL2, second thin-film transistor TFT2, pad PD2, and extension part EX2 is denoted by BM2. In this case, for example, the black matrix BM1 is positioned back to back with respect to another black matrix BM (this black matrix BM is also denoted by BM1 in FIG. 1) which covers the first gate signal line GL1 in the second pixel row PG2, thin-film transistor TFT, pad PD, and extension part EX disposed close to the first gate line. Therefore, these black matrixes are formed in a combined form.

Over the plane, which faces the liquid crystal layer, of the second substrate SUB2, color filters, a planarizing film, etc. are formed, besides the above black matrixes, but their depiction is omitted.

In the thus configured liquid crystal display device, the black matrix BM1 is formed such that each of its longitudinal sides somewhat protrudes into the regions of the pixels, taking account of an alignment offset in boding the first substrate SUB1 and the second substrate SUB2 together. For this reason, for example, in the second pixel PIX2 in the first pixel row PG1, a region that is close to the first gate signal GL1 and covered by the black matrix BM was a so-called dead space.

In the above-described first embodiment, in this dead space, by forming the capacitive element CE for the first pixel PIX1, a decrease in the pixel aperture ratio is, avoided. In this case, if an increase in the capacitance of the capacitive element CE is prioritized over the pixel aperture ratio, the above extension part EX1 of the source electrode ST may be configured to have a larger area, so that the extension part EX1 may partially be exposed from the black matrix BM1. In this way, an effect is produced that it is possible to increase the capacitance between the pixel electrode and the common electrode without entailing a significant decrease in the pixel aperture ratio.

In the present embodiment, two pixel regions exist within a region surrounded by two gate signal lines and two drain signal lines, a region defined by a pixel electrode is assumed as one pixel region, and a boundary section exists between the pixel regions. A region through which light from a backlight passes, further limited by a black matrix, is assumed as an effective pixel region.

Second Embodiment

Figure 4:
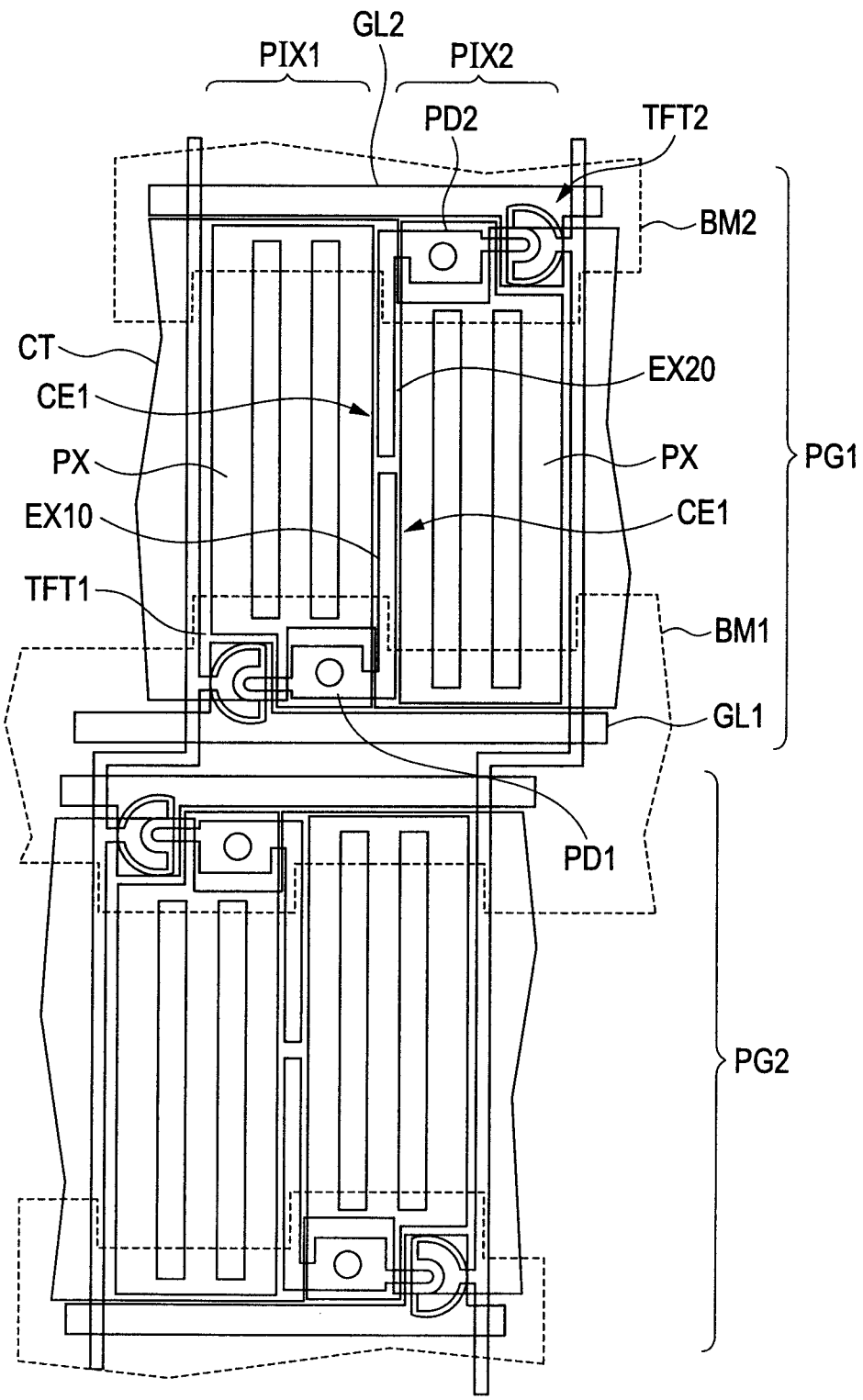
FIG. 4 is a structural diagram of a second embodiment of a liquid crystal display device of the present invention.

FIG. 4 is a structural diagram showing a second embodiment of a liquid crystal display device of the present invention, where pixel structure is depicted corresponding to FIG. 1.

In FIG. 4, a difference in the pixel structure in comparison with FIG. 1 lies in the extension part EX of a source electrode of a thin-film transistor TFT. Specifically, in the first pixel PIX1, the extension part EX (denoted by EX10 in FIG. 4) which is formed together with a pad PD1 extends in a boundary section between, e.g., the first pixel PIX1 and the second pixel PIX2, when viewed from a planar view, i.e., extends so that it is positioned between the pixel electrode (elements) PX in the first pixel PIX1 and the pixel electrode (elements) PX in the second pixel PIX2. In the second pixel PIX2 also, similarly, the extension part EX (denoted by EX20 in FIG. 4) which is formed together with a pad PD2 extends in a boundary section between, e.g., the first pixel PIX1 and the second pixel PIX2, when viewed from a planar view, i.e., extends so that it is positioned between the pixel electrode (elements) PX in the first pixel PIX1 and the pixel electrode (elements) PX in the second pixel PIX2. Both the extension part EX10 and the extension part EX20 are positioned in the boundary between the first pixel PIX1 and the second pixel PIX2 and the forward end of the extension part EX10 and the forward end of the extension part EX20 face each other across a gap therebetween without being coupled together.

The boundary section between the first pixel PIX1 and the second pixel PIX2 is a region where no drain signal line DL is formed. This region is defined to have a relatively broad width so that an electric field from the pixel electrode (elements) PX of the first pixel PIX1 has no effect on the second pixel PIX2 and an electric field from the pixel electrode (elements) PX of the second pixel PIX2 has no effect on the first pixel PIX1. Accordingly, in this region, capacitive elements CE (denoted by CE1 in FIG. 4) are formed between each of the above extension parts EX10, EX20 and the common electrode CT, the passivating film PAS acting as a dielectric film for the capacitive elements. It is thus possible to make an increase in the capacitance without entailing a decrease in the pixel aperture ratio.

Third Embodiment

Figure 5:
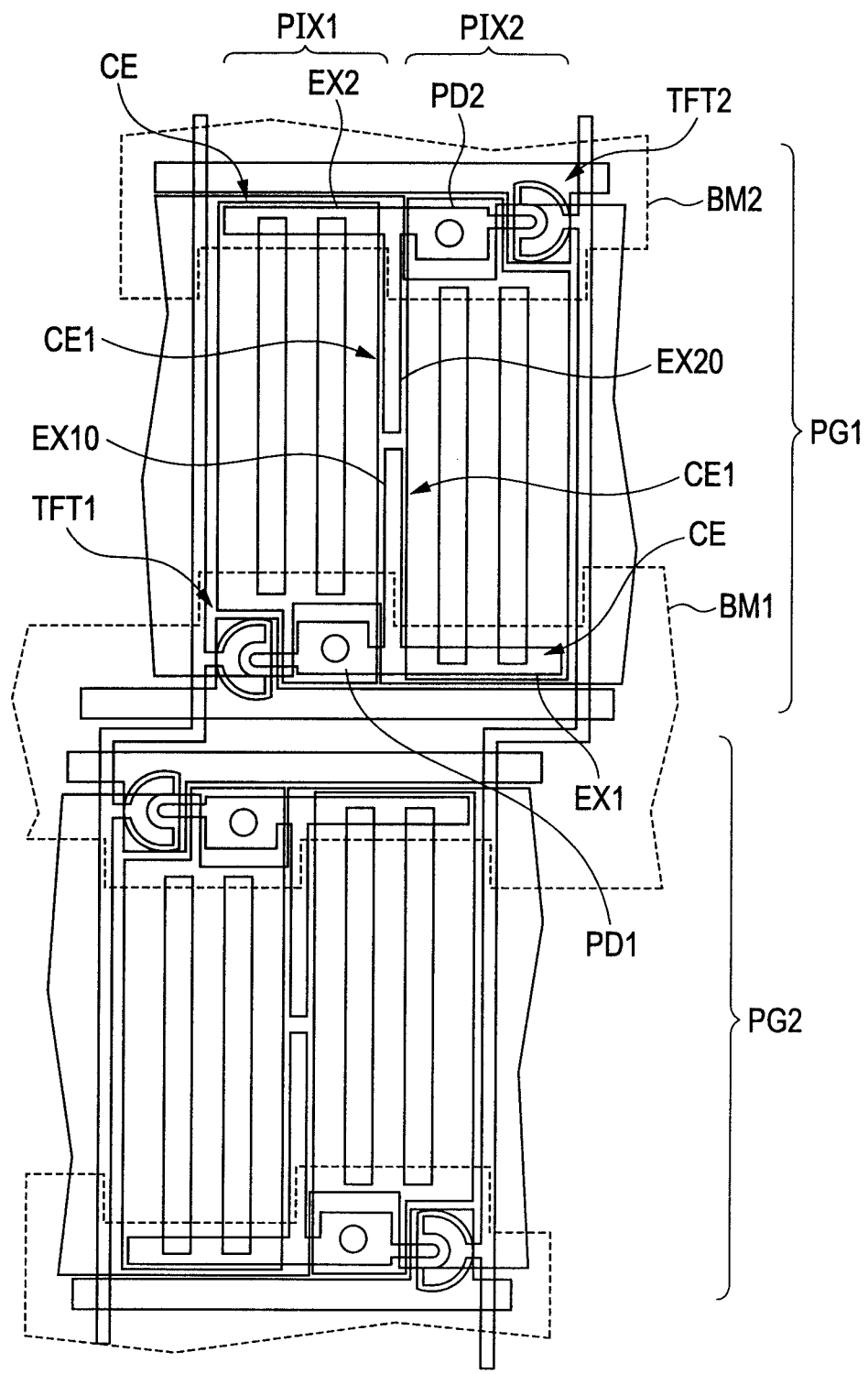
FIG. 5 is a structural diagram of a third embodiment of a liquid crystal display device of the present invention.

FIG. 5 is a structural diagram showing a third embodiment of a liquid crystal display device of the present invention, where the pixel structure is depicted corresponding to FIG. 1.

In FIG. 5, a difference in the pixel structure in comparison with FIG. 1 is adding the extension parts EX10, EX20 shown in the second embodiment (FIG. 4) to the basic structure shown in FIG. 1. That is, taking the first pixel PIX1 in the pixel row PG1 as an example, additional capacitive elements CE1 are provided in the structure, besides the capacitive elements CE.

Accordingly, it is possible to make an increase in the capacitance without entailing a decrease in the pixel aperture ratio.

Fourth Embodiment

In the embodiments described hereinbefore, the pixels are constructed in such a manner that, for each pixel PX, a common electrode CT including a planar pattern is formed on the passivating film PAS and a plurality of pixel electrode elements PX including linear patterns are formed over the common electrode with the insulation film IN intervening therebetween. However, it will be obvious that the above common electrode CT may be formed in an underlying layer with respect to the above passivating film PAS.

Figure 6:
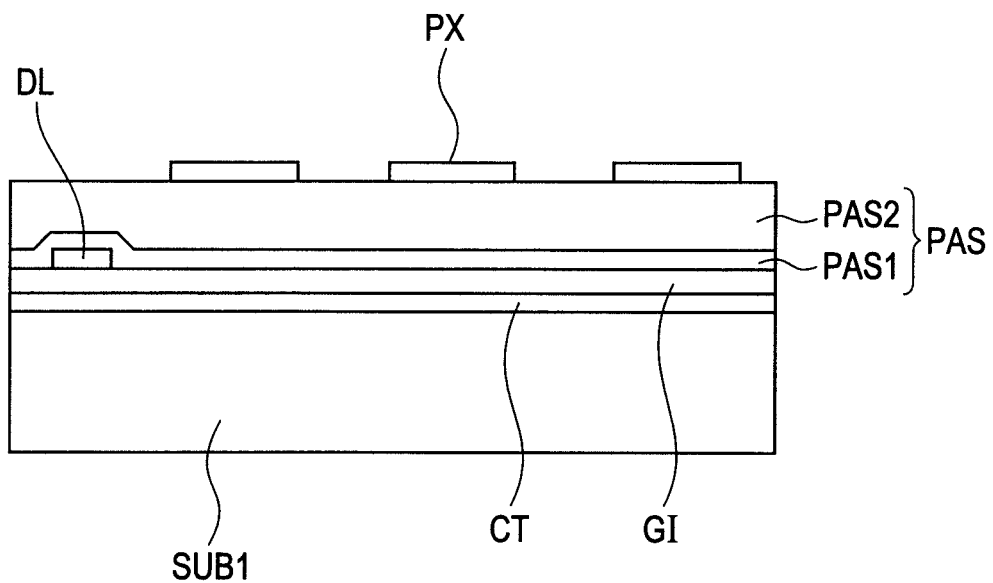
FIG. 6 is a structural diagram of a fourth embodiment of a liquid crystal display device of the present invention.

FIG. 6 is a cross-sectional diagram (a cross section along a line VI-VI in FIG. 1) showing a fourth embodiment, where the common electrode CT is formed, for example, on the surface of the first substrate SUB1. That is, the common electrode CT is formed in the same layer as the gate signal line GL, which is not shown, without being electrically connected to the gate signal line GL. Thus, the pattern of the common electrode CT viewed in a planar view is vertically the same as the pattern of the common electrode CT shown in FIG. 1.

Over the first substrate SUB1, an insulation film GI covering the above common electrode CT (gate signal GL), inter alia, is formed. On the surface of this insulation film GI, a drain signal line DL is formed. Here, one electrode (the above-mentioned extension part EX) of a capacitive element CE is formed together with the drain signal line DL. Accordingly, a capacitive element CE is formed, the insulation film GI acting as a dielectric film for the capacitive element of which the other electrode is the common electrode CT.

Over the first substrate SUB1, a passivating film PAS covering the drain signal line DL, extension part EX, etc., inter alia, is further formed. On the surface of this passivating film PAS, pixel electrode elements PX are formed. Each pixel electrode element PX is electrically connected to the source electrode ST of the thin-film transistor TFT through a contact hole, not shown, which is defined in the passivating film PAS.

Fifth Embodiment

In the embodiments described hereinbefore, the common electrode CT is formed so as to be positioned in an underlying layer with respect to the pixel electrode elements PX. However, this is not restrictive. It will be obvious that the common electrode CT may be formed in an upper layer than the pixel electrode elements PX.

Figure 7:
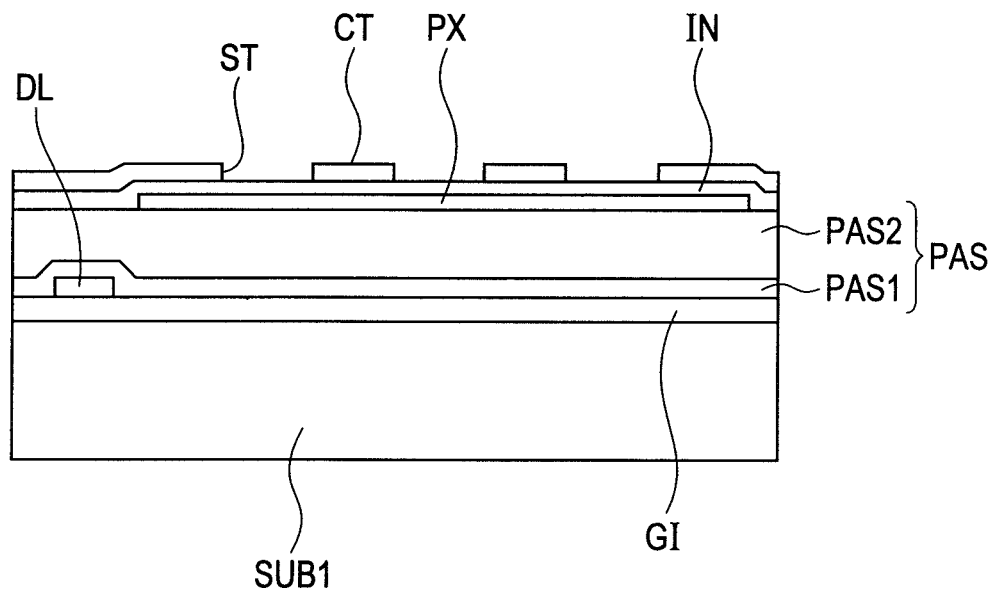
FIG. 7 is a structural diagram of a fifth embodiment of a liquid crystal display device of the present invention.

FIG. 7 is a diagram depicting an alternative pixel structure corresponding to FIG. 6. In FIG. 7, on the upper surface of the passivating film PAS, a pixel electrode PX is formed. This pixel electrode PX is formed as a planar pattern formed independently for each pixel. This pixel electrode PX is electrically connected to the source electrode ST of the thin-film transistor TFT through a contact hole, not shown, which is defined in the passivating film PAS. On the upper surface of this pixel electrode PX, a plurality of common electrode elements CT including linear patterns are formed. These common electrode elements CT are produced as follows: a plurality of liner patterns are produced by defining (cutting) a plurality of slits (denoted by ST in FIG. 7) arranged side by side in a translucent, electrically conductive film formed over the display region. Accordingly, in a region where one electrode (extension part EX) of a capacitive element CE, not shown, is formed, the common electrode CT is formed so as to be superposed over this region. A capacitive element CE is formed, the above insulation film IN and passivating film PAS acting as a dielectric film for the capacitive element.

While the present invention has been described using its exemplary embodiments, the LCD and pixel structures described hereinbefore in each embodiment are only exemplary and the present invention can be modified appropriately without departing from the scope of the technical concept thereof. The LCD and pixel structures described in each embodiment may be combined and applied, unless conflicting with each other.

What is claimed is:

1. A liquid crystal display device comprising:
a first substrate and a second substrate placed to sandwich a liquid crystal layer therebetween; and
pixels over a plane which faces the liquid crystal layer of the first substrate, each pixel including a first electrode and a second electrode placed over or under the first electrode with a first insulation film intervening therebetween, wherein one of the first and second electrodes serves as a pixel electrode which is supplied with an image signal and the other electrode serves as a common electrode,
wherein a plurality of pixels are disposed along a first direction and form a pixel row,
wherein a plurality of pixel rows are disposed along a second direction perpendicular to the first direction,
wherein each of the pixel rows includes a first pixel and a second pixel which are supplied with a gate signal by a first gate signal line and a second gate signal line, respectively, extending along the first direction, wherein the first pixel is connected to the first gate signal line and the second pixel is connected to the second gate signal line,
wherein a first drain signal line and a second drain signal line extending in the second direction are laid to sandwich the first pixel and the second pixel therebetween,
wherein the first pixel is configured such that an image signal from the first drain signal line is supplied to the pixel electrode via a first thin-film transistor which is driven by a signal from the first gate signal line and placed close to the first gate signal line,
wherein the second pixel is configured such that an image signal from the second drain signal line is supplied to the pixel electrode via a second thin-film transistor which is driven by a signal from the second gate signal line and placed close to the second gate signal line,
wherein a source electrode, which is electrically connected to the pixel electrode of the first thin-film transistor, includes an extension part extending into a region of the second pixel, close to the first gate signal line, the extension part being formed overlapping the common electrode formed in the second pixel, when viewed from a planar view, with a second insulation film intervening between the extension part and the common electrode, and
wherein a source electrode, which is electrically connected to the pixel electrode of the second thin-film transistor, includes an extension part extending into a region of the first pixel, close to the second gate signal line, the extension part being formed overlapping the common electrode formed in the first pixel, when viewed from a planar view, with the second insulation film intervening between the extension part and the common electrode, and wherein the extension part of the source electrode of the first thin-film transistor of the first pixel is formed on the same layer as the source electrode of the first thin-film transistor but is formed on a different layer from the pixel electrode of the first pixel, and is configured to form a first capacitor with the common electrode in the second pixel, wherein the common electrode overlapping with the extension part of the source electrode of the first thin-film transistor is configured to form a second capacitor with the pixel electrode of the second pixel, wherein the extension part of the source electrode of the second thin-film transistor of the second pixel is formed on the same layer as the source electrode of the second thin-film transistor but is formed on a different layer from the pixel electrode of the second pixel, and is configured to form a third capacitor with the common electrode in the first pixel, and wherein the common electrode overlapping with the extension part of the source electrode of the second thin-film transistor is configured to form a fourth capacitor with the pixel electrode of the first pixel.

2. The liquid crystal display device according to claim 1, wherein the source electrode of the first thin-film transistor is equipped with a first pad that provides a contact with the pixel electrode of the first pixel, the first pad being adjacent to the first thin-film transistor and the first gate signal line, and the source electrode of the second thin-film transistor is equipped with a second pad that provides a contact with the pixel electrode of the second pixel, the second pad being adjacent to the second thin-film transistor and the second gate signal line.

3. The liquid crystal display device according to claim 2, wherein the first pad is formed between the source electrode of the first thin-film transistor and the extension part of the source electrode extending into the region of the second pixel, close to the first gate signal line, and the second pad is formed between the source electrode of the second thin-film transistor and the extension part of the source electrode extending into the region of the first pixel, close to the second gate signal line.

4. The liquid crystal display device according to claim 1,
wherein a first light shielding film and a second light shielding film are formed on a plane, which faces the liquid crystal layer, of the second substrate, the first light shielding film covering at least the first gate signal line and the first thin-film transistor and the second light shielding film covering at least the second gate signal line and the second thin-film transistor, when viewed from a planar view, wherein the extension part of the source electrode of the first thin-film transistor is formed, at least in part, overlapping the first light shielding film, and wherein the extension part of the source electrode of the second thin-film transistor is formed, at least in part, overlapping the second light shielding film.

\* \* \* \* \*